United States Patent
Butler

(10) Patent No.: US 6,798,497 B2
(45) Date of Patent: Sep. 28, 2004

(54) LITHOGRAPHIC PROJECTION APPARATUS, DEVICE MANUFACTURING METHOD, DEVICE MANUFACTURED THEREBY, AND MEASUREMENT METHOD

(75) Inventor: Hans Butler, Best (NL)

(73) Assignee: ASML Netherlands B.V. (NL)

( * ) Notice: Subject to any disclaimer, the term of this patent is extended or adjusted under 35 U.S.C. 154(b) by 0 days.

(21) Appl. No.: 10/170,227

(22) Filed: Jun. 13, 2002

(65) Prior Publication Data

US 2003/0016340 A1 Jan. 23, 2003

(30) Foreign Application Priority Data

Jun. 13, 2001 (EP) ............................................ 01202265

(51) Int. Cl.[7] .................... G03B 27/58; G03B 27/42; H02P 1/54
(52) U.S. Cl. ............................ 355/72; 355/53; 318/51
(58) Field of Search ............................ 355/72, 53, 77; 356/399, 400, 401; 310/10, 12; 318/35, 51

(56) References Cited

U.S. PATENT DOCUMENTS

| 5,844,664 A | 12/1998 | Van Kimmenade et al. |
| 6,188,464 B1 | 2/2001 | Makinouchi |
| 6,281,643 B1 * | 8/2001 | Ebihara ........................ 318/35 |

* cited by examiner

Primary Examiner—Peter B. Kim
(74) Attorney, Agent, or Firm—Pillsbury Winthrop LLP

(57) ABSTRACT

A lithographic projection apparatus includes a first object table configured and arranged to hold a patterning structure capable of patterning a projection beam of radiation according to a desired pattern and a second object table configured and arranged to hold a substrate. A positioning structure is configured and arranged to generate a force so as to move one of the object tables with respect to a projection system during an imaging operation. Processing circuitry is configured and arranged to read from a data storage device a compensation force value that corresponds to a value of a signal representing a position of said object table and to generate a force adjustment signal based on the compensation force value. The positioning structure is further configured and arranged to generate the force according to the force adjustment signal.

28 Claims, 6 Drawing Sheets

Fig.6.
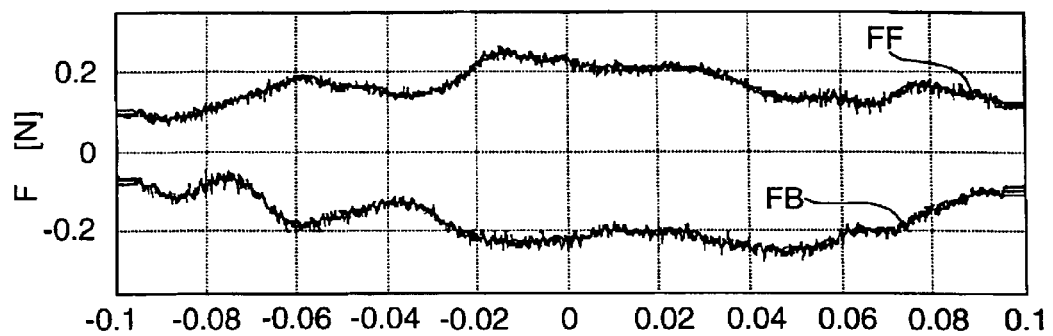
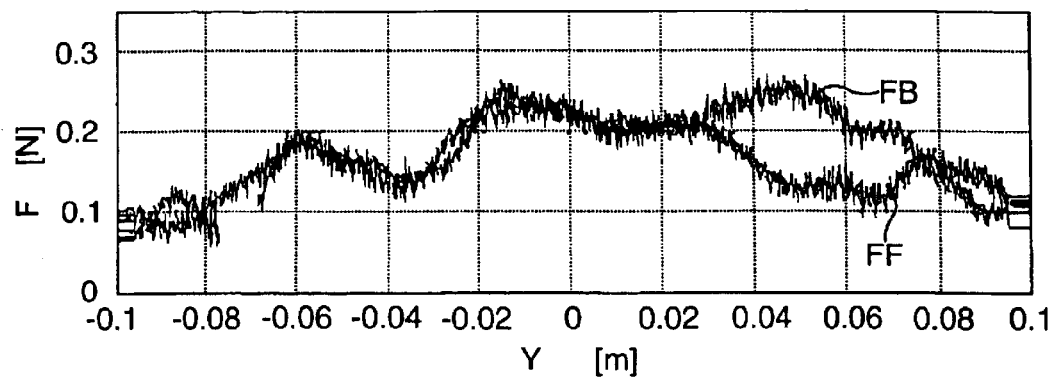

LITHOGRAPHIC PROJECTION APPARATUS, DEVICE MANUFACTURING METHOD, DEVICE MANUFACTURED THEREBY, AND MEASUREMENT METHOD

This application claims priority to EP 01202265.3 filed Jun. 13, 2001, which document is herein incorporated by reference.

FIELD OF THE INVENTION

The present invention relates to lithographic projection methods, systems, and apparatus and to products of such methods, systems, and apparatus.

BACKGROUND

The term "patterning structure" should be broadly interpreted as referring to any structure or field that may be used to endow an incoming radiation beam with a patterned cross-section, corresponding to a pattern that is to be created in a target portion of the substrate; the term "light valve" can also be used in this context. Generally, such a pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the projection beam causes selective transmission (in the case of a transmissive mask) or reflection (in the case of a reflective mask) of the radiation impinging on the mask, according to the pattern on the mask.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array. An example of such a construction is given in U.S. Pat. No. 5,229,872, which is incorporated herein by reference.

A first object table may be used to hold the patterning structure at a desired position in the incoming projection beam and to allow the patterning structure to be moved relative to the beam if so desired. For purposes of simplicity, the rest of this text may, at certain locations, specifically direct itself to examples involving a mask and a mask table; however, the general principles discussed in such instances should be seen in the broader context of the patterning structure as hereabove set forth.

The term "projection system" should be broadly interpreted as encompassing various types of projection system, including refractive optics, reflective optics, and catadioptric systems, for example. For the sake of simplicity, the projection system may hereinafter be referred to as the "lens". The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin-stage lithographic apparatus are described, for example, in U.S. Pat. No. 5,969,441 and WO 98/40791, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single substrate will contain a whole network of adjacent target portions that are successively irradiated via the projection system (e.g. one at a time). Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus (commonly referred to as a step-and-scan apparatus), each target portion is irradiated by progressively scanning the mask pattern under the projection beam in a given reference direction (the "scanning" direction) while synchronously scanning the substrate table parallel or antiparallel to this direction; since, in general, the projection system will have a magnification factor M (generally <1), the speed V at which the substrate table is scanned will be a factor M times that at which the mask table is scanned. The projection beam in a scanning type of apparatus may have the form of a slit having a slit width in the scanning direction. More information with regard to lithographic devices as here described can be gleaned, for example, from U.S. Pat. No. 6,046,792, incorporated herein by reference.

In a scanning type of lithographic projection apparatus, positioning structures are used to move the tables during imaging. It is very important that these positioning structures will work with a high precision so that both tables will move synchronously during imaging and will not cause imaging errors. Positioning structures that are not working with the required precise synchronization may lead to high MSD (moving standard deviation) and high MA (moving average) synchronization errors for the tables. While both tables receive the correct, exactly time-synchronous movement profiles from a set point generator, what counts is the relative position error between the substrate and the mask table:

$$e = e_{WS} - e_{RS}/4 \qquad [1]$$

wherein $e_{WS}$ equals the position difference between the substrate table and its set point, and $e_{RS}$ equals the position difference between the mask table and its set point.

FIG. 2 shows an example of the acceleration a of a substrate table during a scan in the Y-direction. To make an exposure scan, the substrate table has to move over a distance that is equal to the target portion length 11 plus two times the slit width 13 plus the travel length 7 during the required settling time. The settling time enables the position errors to decrease. The acceleration takes place as the table travels the acceleration distance 5, and the deceleration takes place as the table travels the deceleration distance 15. At the start of the exposure 17, the first point on the target portion to be exposed reaches the illuminated slit 13. After the exposure time $T_{exp}$ this first-exposed point leaves the slit 13. After a time period that equals the target portion length divided by the stage speed, the very last point 19 of the target portion leaves the slit. Together, these amounts add up to the mentioned scan length 9.

The average stage position error during the time a specific point of the target portion is in the illuminated slit 13 determines the shift in the radiation sensitive material on the substrate of this specific point (overlay). For every point x in the target portion, such a shift can be calculated, which is called the Moving Average (MA) error of this point x:

$$MA(x) = \frac{1}{T_{exp}} \int_{t_X - T_{exp}/2}^{t_X + T_{exp}/2} e(t) \, dt \qquad [2]$$

Here, $T_{exp}$ is the exposure time (which equals the slit width divided by the scan speed of the substrate table), $e(t)$ is the relative substrate table/mask table position error at substrate level as function of the time, and $t_X$ is the time instant that point x is positioned at the lens center.

In addition to an average position error, the position error may have high-frequency variations during exposure, resulting in fading effects such as image non-sharpness or contrast loss. This effect is characterized by the Moving Standard Deviation (MSD), which equals the standard deviation of the relative position error during the exposure:

$$MSD(x) = \sqrt{\frac{1}{T_{exp}} \int_{t_X - T_{exp}/2}^{t_X + T_{exp}/2} [e(t) - MA(x)]^2 \, dt} \qquad [3]$$

Both MA and MSD are calculated for every point in the target portion along the scanning direction Y, and the peak MA and MSD values in the target portion are used as performance indicators.

It has been proposed in U.S. Pat. No. 6,373,072 B1 incorporated herein by reference to provide a control system for the substrate and mask tables of a lithographic apparatus in which errors in the position of the substrate table are compensated for by their inclusion as a feed-forward control in the mask table control loop. Specifically, in such a system the substrate table error is lowpass-filtered, and the output of the filter is then added to the mask table set point. The output of the filter is also twice differentiated and multiplied by the mask table mass, and the resultant force is applied to the mask table. This proposed system is based on the realizations that the absolute positions of the mask and substrate tables are less important than their relative position and that it is easier to control the position of the mask than the position of the substrate. The latter condition applies because any absolute error in the positioning of the mask is multiplied by the magnification of the lens system before it adds up to the imaging error at the substrate surface. The magnification of the lens will be typically 0.25 or 0.2, so that any error at the mask will be four or five times smaller at the surface of the wafer.

SUMMARY

Embodiments of the invention may include lithographic projection apparatus that have an improved synchronization and consequently a lower MSD and MA value.

A lithographic projection apparatus according to one embodiment of the invention includes a first object table configured and arranged to hold a patterning structure capable of patterning a projection beam of radiation according to a desired pattern and a second object table configured and arranged to hold a substrate. A positioning structure is configured and arranged to generate a force so as to move one of the object tables with respect to a projection system during an imaging operation. Processing circuitry is configured and arranged to read from a data storage device a compensation force value that corresponds to a value of a signal representing a position of said object table and to generate a force adjustment signal based on the compensation force value. The positioning structure is further configured and arranged to generate the force according to the force adjustment signal. The signal representing the position of an object table may be generated with a measurement system for measuring the position of the object table or may be a set point generated by a controller configured and arranged to control the movement of the object table.

A device manufacturing method according to one embodiment of the invention includes using a patterning structure held by a first object table to endow a projection beam of radiation with a pattern in its cross-section. The patterned beam of radiation is projected onto a target portion of a layer of radiation-sensitive material that at least partially covers a substrate on a second object table. This method also includes reading a compensation force value from a data storage device, where the compensation force value corresponds to a value of a signal representing a position of one of the object tables. A force adjustment signal is generated in response to the compensation force value, and a force is applied to the object table according to the force adjustment signal.

A measurement method according to a further embodiment of the invention includes controlling a positioning structure of a lithographic projection apparatus to move an object table of the lithographic projection apparatus in at least a first degree of freedom such that the object table moves with a constant speed in the first degree of freedom. This method also includes storing (e.g. in a data storage device) information relating to a value of a force exerted by the positioning structure to keep the object table moving with the constant speed in the first degree of freedom. For example, this information may be stored as a function of a corresponding position of the object table in the first degree of freedom.

Although specific reference may be made in this text to the use of apparatus and/or methods according to embodiments of the invention in the manufacture of ICs, it should be explicitly understood that such apparatus and/or methods have many other possible applications. For example, such applications may include the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate", and "target area" or "target portion", respectively.

In the present document, the terms illumination radiation and illumination beam are used to encompass all types of electromagnetic radiation or particle flux, including, but not limited to, ultraviolet (UV) radiation (e.g. at a wavelength of 365 nm, 248 mn, 193 nm, 157 nm or 126 nm), extreme ultraviolet (EUV) (e.g. having a wavelength in the range 5–20 nm), X-rays, electrons and ions.

BRIEF DESCRIPTION OF THE DRAWINGS

The present invention will be described below with reference to exemplary embodiments and the accompanying schematic drawings, in which:

FIG. 6 shows velocity and position-dependent external magnetic disturbance forces in the Y-direction for a first object table moving in the Y-direction.

DETAILED DESCRIPTION

Figure 1:
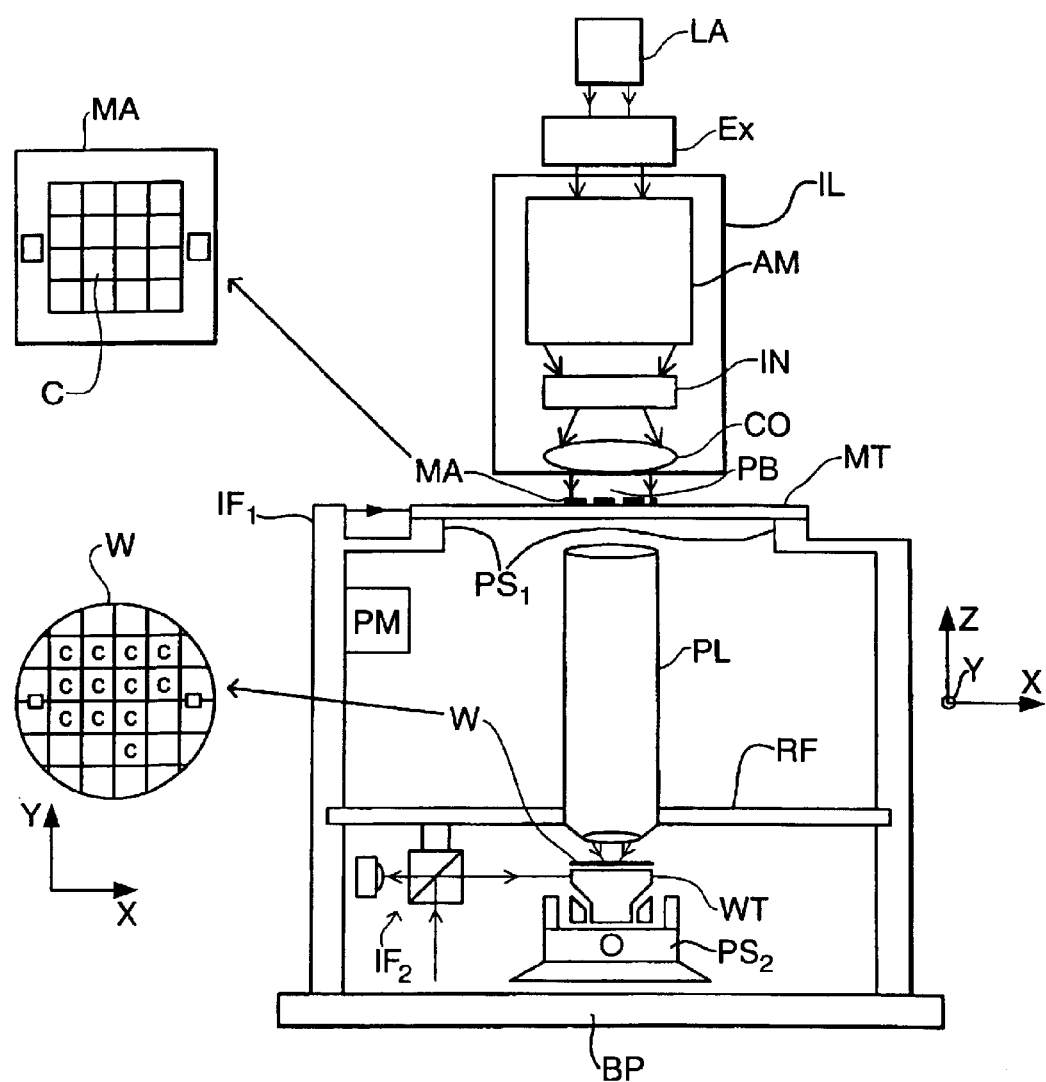
FIG. 1 depicts a lithographic projection apparatus according to an embodiment of the invention.
Figure 2:
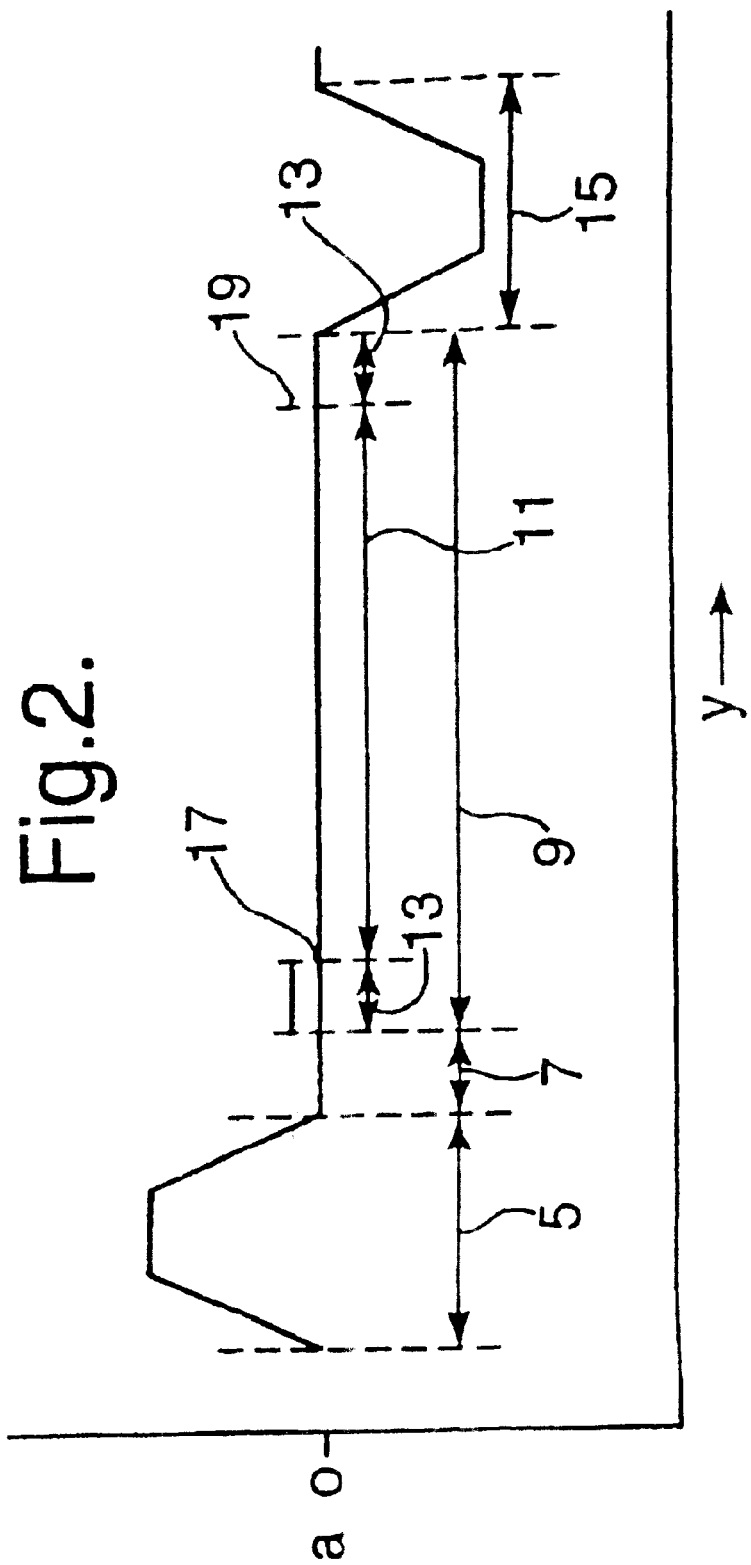
FIG. 2 shows an acceleration profile of an object table during exposure.

FIG. 1 schematically depicts a lithographic projection apparatus according to one embodiment of the invention. The apparatus comprises:

A radiation system LA, IL for supplying a projection beam PB of radiation (e.g. UV or EUV radiation, x-rays, electrons or ions);

A first object table (mask table) MT provided with a mask holder for holding a mask MA (e.g. a reticle), and connected to a first positioning structure PSI for accurately moving the mask with respect to item PL;

A second object table (substrate table) WT provided with a substrate holder for holding a substrate W (e.g. a resist-coated semiconductor wafer), and connected to a second positioning structure PS2 for accurately moving the substrate with respect to item PL; and A projection system ("lens") PL (e.g. a refractive or catadioptric system, a mirror group, or an array of field deflectors) for imaging an irradiated portion of the mask MA onto a target portion C of the substrate W. As here depicted, the apparatus is of a transmissive type (i.e. has a transmissive mask). However, in general, it may also be of a reflective type, for example. Alternatively, the apparatus may employ another kind of patterning structure, such as a programmable mirror array of a type as referred to above.

Source LA (e.g. a mercury lamp, an excimer laser, a discharge plasma source, a laser-produced plasma source, an undulator provided around the path of an electron beam in a storage ring or synchrotron, or an electron or ion beam source) produces a beam of radiation. This beam is fed into an illumination system (illuminator) L, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held in a mask holder on a mask table MT. Having passed through (or been selectively reflected by) the mask MA, the beam PB passes through the lens PL, which focuses the beam PB onto a target portion C of the substrate W. With the aid of the measuring system (e.g. an interferometer) IF2 and the second positioning structure PS2, the substrate table WT may be moved accurately, e.g. so as to position different target portions C in the path of the beam PB. Similarly, the first positioning structure PS1 can be used to accurately position the mask MA with respect to the path of the beam PB, e.g. after mechanical retrieval of the mask MA from a mask library, or during a scan. In general, movement of the object tables MT, WT can be realized with the aid of a long-stroke module (coarse positioning) and a short-stroke module (fine positioning), which are not explicitly depicted in FIG. 1. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. a single "flash") onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V =Mv, in which M is the magnification of the lens PL (typically, M=¼ or ⅕). In this manner, a relatively large target portion C can be exposed, without having to compromise on resolution.

The apparatus may also include a base frame BP (also referred to as a base plate or machine frame) to support components of the apparatus such as the projection system PL and sensors such as the measuring system.

As here depicted, both tables are movable, and the measuring system comprising the interferometers IF1 and IF2 measures the positions of the first and second object tables. The signal generated with the interferometer IF1 may be used to generate a force adjustment signal for the positioning structure PS1, and the signal generated with interferometer IF2 may be used to generate a force adjustment signal for the positioning structure PS2.

The inventor has discovered that certain magnetic material may exert forces on one or more of the object tables during movement of the table. The external magnetic disturbance forces may depend on either the position of the object table, or on the position in combination with the velocity of the object table. Position-dependent external magnetic disturbance forces may be caused by, e.g., attraction between permanent magnets present in the object tables and magnetic materials in the vicinity of the movement path of the object table. One or both of these dependencies may be determined and stored in a data storage device, wherefrom they can be read out to adjust the force response of the positioning structure in advance so as to compensate for the external magnetic disturbance forces.

In a step-and-scan type of apparatus, each target portion is irradiated by moving the mask pattern under the projection beam in a given reference direction while synchronously moving the substrate table parallel or anti-parallel to this direction. To achieve that the mask pattern and the substrate table are moving synchronously, it is desirable to control the movement of the first and second object tables with a high accuracy. The sensitivity to errors in movement of the object table is very high, because during imaging the tables are moving, and any disturbance force may directly lead to high MSD and MA values. The first object table may be especially sensitive to external magnetic disturbance forces.

Processing circuitry PM operates in conjunction with a data storage device (e.g. a semiconductor, ferroelectric, or magnetoresistive memory, such as DRAM, SRAM, or flash RAM; or a magnetic disk drive) to generate a force adjustment signal for adjusting the force FO exerted by the positioning structure PS1 (or PS2) on its respective object table in response to a measurement signal from the measuring system IF1 (or IF2). The disturbance compensation force value stored in the data storage device may be an array of forces FO to be exerted in the X, Y and/or Rz (rotational movement in the plane X, Y) directions as a function of a position measurement in the Y-direction, which is the scanning direction of the apparatus. Additionally, one could also store forces FO to be exerted in the Rx, Ry and/or Z directions as a function of the Y position. In a further example, one could also store these forces FO as a function of the X, Y and/or Z positions (and possibly also as a function of the Rx, Ry and/or Rz positions).

Storing the forces as a function of the X and Y position may be advantageous in a system that includes a planar motor as according to PCT Patent Application WO 01/18944, incorporated herein by reference. In a planar motor system, the second object table WT will be moved over a long range in the X and Y direction over a plate of magnets. For high-precision positioning, one might use a two-step positioning system in which the planar motor functions as a long stroke motor and an additional Lorentz motor functions as a short stroke motor. The feedforward signal may then be used to compensate for any disturbance of the short-stroke motor caused by the plate of magnets present in the planar motor.

Figure 3:
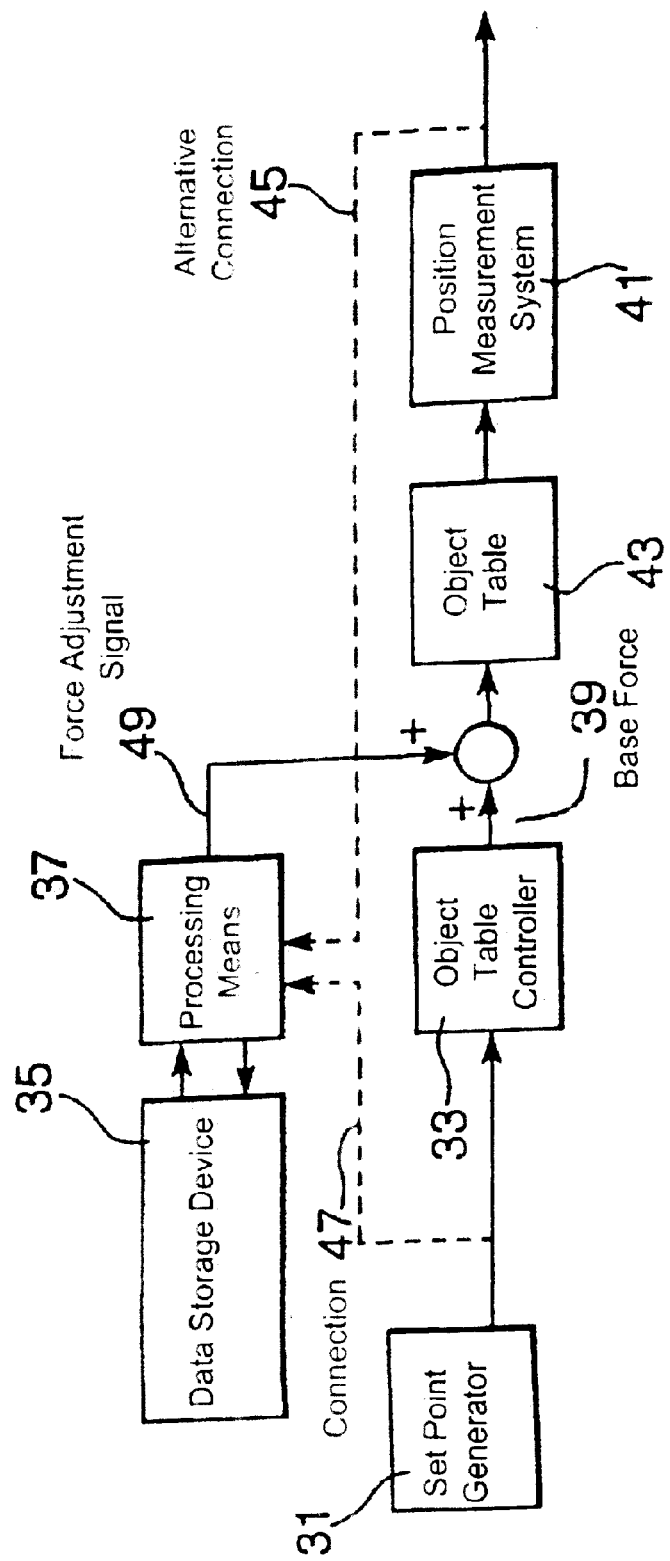
FIG. 3 shows a detailed flow chart of a method according to an embodiment of the invention.

FIG. 3 shows a detailed flow chart of a method according to an embodiment of the invention. The required object table position is generated by a set point generator 31 and is fed to an object table controller 33. The object table controller 33 calculates a base force 39 to be exerted on the object table 43. The position of the object table and therefore the influence of the set point generator will be measured with the position measurement system 41.

The set point of the set point generator 31 is fed to a processing means 37 via connection 47. This set point will be used to obtain a disturbance compensation force value from the data storage device 35. Processing circuitry 37 produces a force adjustment signal 49 based on the disturbance compensation force value that is added to the force 39 to obtain a total force to be exerted on the object table 43. Line 45 gives an alternative for connection 47. If it is required that the disturbance compensation force value is not dependent on the set point generator 31, then it may be desirable to use the connection 45 and use the real measurement data to process the force adjustment signal 49.

Figure 4:
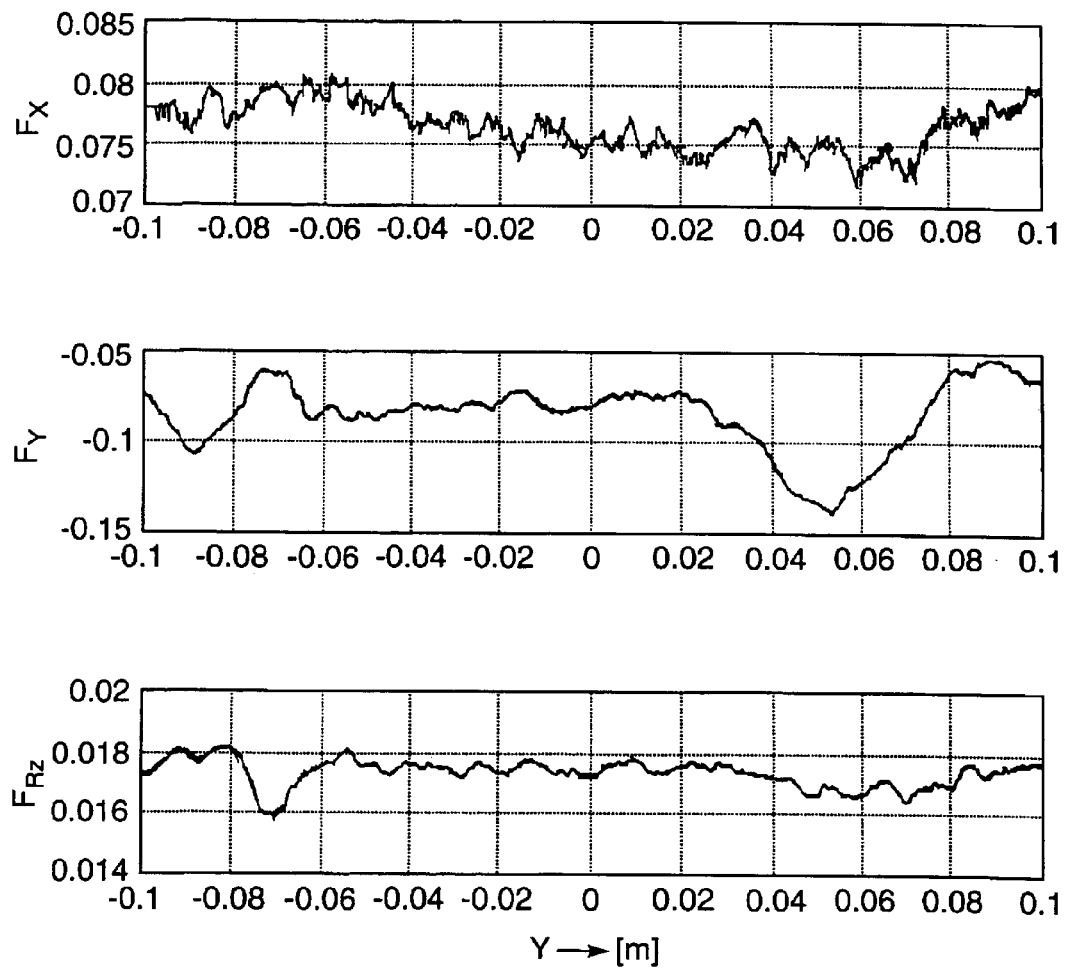
FIG. 4 shows position-dependent external magnetic disturbance forces in the Y, X and Rz direction for a first object table moving in the Y-direction.

FIG. 4 shows a result obtained by moving the first object table in the scanning Y-direction and simultaneously measuring the external magnetic forces exerted on the first object table. Specifically, these measurements were obtained by moving the first object table with a relatively low speed of 0.025 meter per second in the Y-direction and simultaneously measuring the force exerted by the positioning structure to keep the first object table moving with a constant speed in the Y-direction. The constant speed is controlled with a measurement means, and any deviation of the constant speed leads to an adjusted force exerted by the positioning structure. This adjusted force is shown graphically in FIG. 4.

In this example, the measurement means is also used to control the position of the object table in other degrees of freedom (e.g., X and Y), and any deviation from that position also leads to an adjusted force output by the positioning structure, which is also shown in FIG. 4. A low speed ensures that the difference between the required position and the actual position is minimal and hence the force exerted by the positioning structure is an accurate measure of the disturbance force. At around −0.08 and 0.05 m in the Y-direction, strong deviations from a straight line can be observed. The disturbance correction forces as depicted in FIG. 4 can be obtained several times, averaged, and then filtered to enhance the disturbance correction forces in the data storage device as a function of the position in the Y-direction.

Besides a dependence with respect to position, the magnetic disturbance forces exerted on an object table may also show a dependence with respect to speed. At a high moving speed of an object table, for example, a disturbance force may be present at certain positions in the moving range which shows a speed dependency (due, e.g., to eddy current effects). Therefore, it may be desirable to calculate a velocity from the signals produced by the measuring system IF or the set point generator to calculate a force adjustment signal as a function of the disturbance correction force and the speed of the object table.

Figure 5:
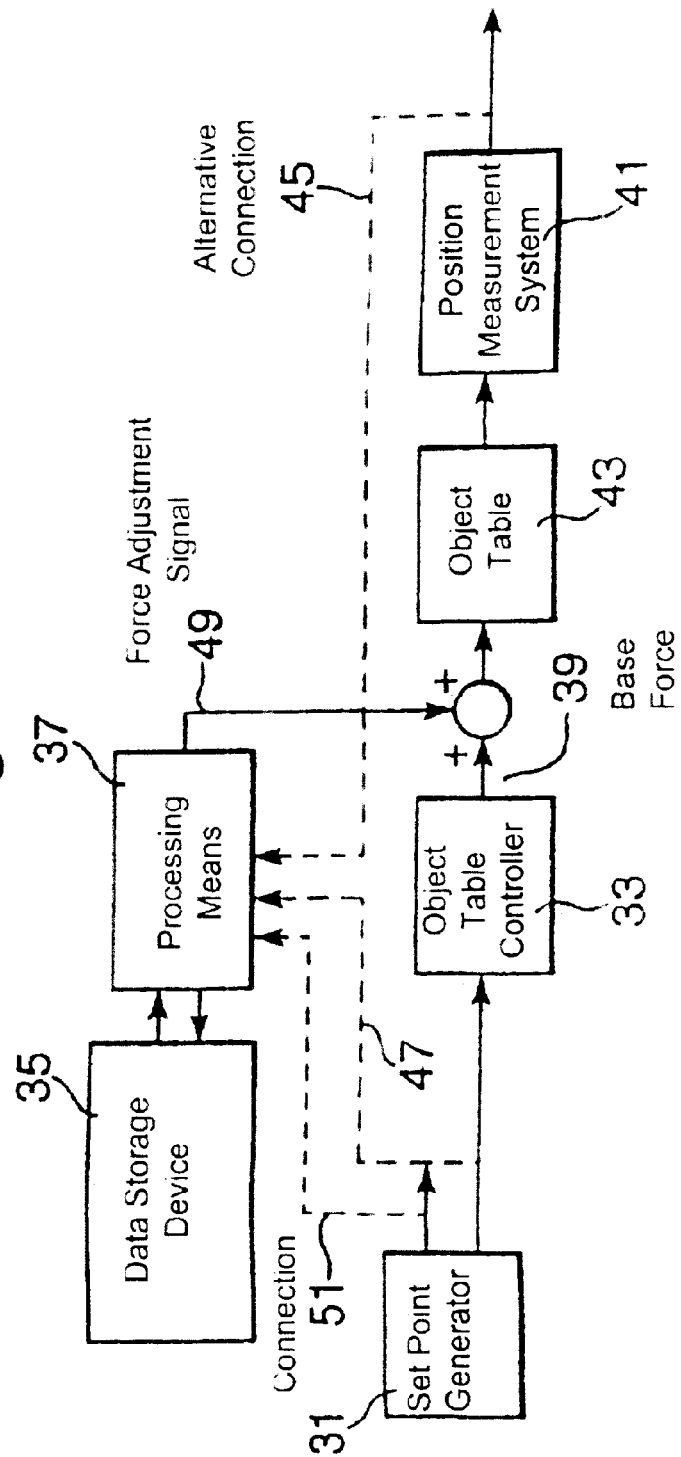
FIG. 5 shows a detailed flow chart of a method according to a further embodiment of the invention.

FIG. 5 shows a detailed flow chart of a method according to a further embodiment of the invention that shares most items with the embodiment shown in FIG. 3. An extra set point, which represents the speed of the object table, is generated by the set point generator 31. This set point is fed via the connection 51 to the processing circuitry 37. In this case, processing circuitry 37 includes a calculating means that calculates a force adjustment signal as a function of the position and the velocity of the object table. For example, the calculating means may calculate a force adjustment signal by multiplying the disturbance compensation force value with the velocity of the object table.

FIG. 6 shows the velocity-dependent magnetic disturbance forces in the Y-direction of the first object table moving in the Y-direction. These measurements are obtained by moving the first object table with a relatively high speed of 1 meter per second in the Y-direction and simultaneously measuring the force exerted by the positioning structure to keep the first object table moving with a constant speed in the first direction. The constant speed is controlled with the measuring system (e.g. IF1 (and IF2) in an apparatus as shown in FIG. 1, or position measurement system 41 in a method as shown in FIGS. 3 or 5). The force exerted by the positioning structure to keep the first object table moving with a constant speed is stored in the data storage device as a function of the position in the Y-direction. Further, the force exerted by the positioning structure to keep the first object table in a constant position in the other degrees of freedom is also checked by the measuring means, and the force exerted is stored in the data storage device as a function of the position in the first degree of freedom.

In the graph on top of FIG. 6, the line FF shows the forces when the first object table is moved forward in the Y-direction, and the line FB shows the forces when the first object table is moved backward in the Y-direction. In the bottom graph, the line FB of the top graph is multiplied by −1 and plotted in the same graph as line FF. Lines FF and -FB show a nearly perfect match except for the region of +0.05 meter. This region coincides with the region where the position-dependent external magnetic forces are nonzero in the graph of the Y-forces of FIG. 4. The fact that the force measurements have an opposite sign for opposite movement directions demonstrates that the disturbance forces are largely velocity-dependent. The forces as depicted in FIG. 6 can be filtered to obtain a disturbance force compensation table including forces to be exerted to compensate for the velocity- and position-dependent external magnetic disturbance forces as a function of the position in the Y-direction. The values in the table should be multiplied with the velocity of the first object table to get the adjustment force FO or 49. Table 1 shows the moving average MA and the moving standard deviation MSD values in nanometers for the X- and Y-direction and in nanoradians for Rz for the first object table.

TABLE 1

|  | MA-X [nm] | MA-Y [nm] | MA-Rz [nrad] | MSD-X [nm] | MSD-Y [nm] | MSD-Rz [nrad] |
| --- | --- | --- | --- | --- | --- | --- |
| No disturbance force compensation | 2.27 | 4.57 | 12.92 | 11.64 | 10.57 | 42.29 |
| Position-dependent force compensation | 2.28 | 4.35 | 11.83 | 11.68 | 10.11 | 42.08 |
| Velocity-dependent force compensation | 1.77 | 2.66 | 8.57 | 11.37 | 9.43 | 37.24 |
| Position- and Velocity-dependent force compensation | 1.78 | 1.44 | 5.96 | 11.41 | 9.15 | 36.03 |

The table shows that both the MA and the MSD values are improved by applying the disturbance compensation forces according to an embodiment of the invention. For a correct understanding of this table, it is important to keep in mind that the velocity-dependent force correction is in fact dependent on position and velocity.

The positioning structure may include a long-stroke and a short-stroke motor: the long-stroke motor for driving a long-range movement of the object table and the short-stroke motor for taking care of accurate positioning of the object table. The short-stroke motor is moved by the long-stroke motor and may be more sensitive to influences depending on the position and the velocity. Generally, the short-stroke motor is more responsive to small force adjustments than the long-stroke motor, and it may be that the long-stroke motor is just passively following the short-stroke motor. In such cases, it may be desirable to feed the adjustment forces to the short-stroke motor only. A measurement unit for measuring the relative distance between the moving part of the long-stroke motor and the part of the object table that is driven by the short-stroke motor may indicate that both are away from an equilibrium position and that the long-stroke motor has to move to become in equilibrium again.

Preferably this measurement method should be done for relatively high and low speeds and can be done in different degrees of freedom. The latter may be interpreted as the measurement being done while moving the object table in different degrees of freedom and storing the disturbance forces as a function of said different degrees of freedom and/or the measurement being done while moving the object table in one degree of freedom but controlling the position of the object table in more degrees of freedom and storing the disturbance compensation forces in said more degrees of freedom as a function of said one degree of freedom. The measurement can be done by moving back and forward in a degree of freedom, and the results can be averaged and filtered to get a better result. The measurement results can be used to calibrate the lithographic projection apparatus.

Whilst specific embodiments of the invention have been described above, it will be appreciated that the invention as claimed below may be practiced otherwise than as described. It is explicitly noted that the description of these embodiments is not intended to limit the invention as claimed.

I claim:

1. A lithographic projection apparatus configured and arranged to image a pattern onto a substrate, said apparatus comprising:

a first object table configured and arranged to hold a patterning structure capable of patterning the beam of radiation according to a desired pattern;

a second object table configured and arranged to hold a substrate; and a projection system configured and arranged to image the patterned beam onto a target portion of the substrate;

a positioning structure configured and arranged to generate a force so as to move one of the first and second object tables with respect to the projection system during an imaging operation; and processing circuitry configured and arranged to select, from among a plurality of predetermined compensation force values, a compensation force value that corresponds to a value of a signal representing a position of said object table, wherein said processing circuitry is further configured and arranged to generate a force adjustment signal based on said compensation force value, and wherein said positioning structure is further configured and arranged to generate the force according to the force adjustment signal.

2. The lithographic projection apparatus according to claim 1, said apparatus further comprising a measuring system configured and arranged to measure the position of said object table and to generate the signal representing the position of said object table.

3. The lithographic projection apparatus according to claim 1, said apparatus further comprising a control system configured and arranged to control the movement of the object tables and to generate the signal representing the position of said object table.

4. The lithographic projection apparatus according to claim 1, wherein said processing circuitry comprises a calculator configured and arranged to generate the force adjustment signal as a function of the compensation force value and a velocity of said object table.

5. The lithographic projection apparatus according to claim 4, wherein the force adjustment signal includes a product of the compensation force value and the velocity of said object table.

6. The lithographic projection apparatus according to claim 1, wherein said processing circuitry is configured and arranged to read a second compensation force value, and wherein said processing circuitry is configured mid arranged to generate a second force adjustment signal as a function of the second compensation force value and a velocity of said object table, and wherein said positioning structure is further configured and arranged to generate the force according to the second force adjustment signal.

7. The lithographic projection apparatus according to claim 1, wherein said positioning structure is configured and arranged to move said object table in at least two degrees of freedom, and wherein said processing circuitry is configured and arranged to read at least two compensation force values in response to the signal representing the position of said object table, and wherein the force adjustment signal corresponds to the at least two compensation force values, and wherein said positioning structure is configured and arranged to generate the force according to the force adjustment signal in said at least two degrees of freedom.

8. The lithographic projection apparatus according to claim 1, wherein said positioning structure is configured and arranged to move said object table in at least two degrees of freedom, and wherein the signal representing the position of said object table represents the position of said object table in said at least two degrees of freedom.

9. The lithographic projection apparatus according to claim 1, wherein said positioning structure includes a short-stroke motor configured and arranged to move said object table and a long-stroke motor configured and arranged to move said object table, and wherein said positioning structure is configured and arranged to adjust the force exerted by the short-stroke motor according to the force adjustment signal.

10. The lithographic projection apparatus according to claim 1, said apparatus further comprising a radiation system configured and arranged to provide the beam of radiation, wherein said radiation system comprises a radiation source.

11. The lithographic projection apparatus according to claim 1, wherein the patterning structure includes a mask, and wherein the first object table includes a mask table configured and arranged to hold the mask.

12. A device manufacturing method, said method comprising:

using a patterning structure held by a first object table to endow a beam of radiation with a pattern in its cross-section;

projecting the patterned beam of radiation onto a target portion of a layer of radiation-sensitive material that at least partially covers a substrate on a second object table;

selecting, from among a plurality of predetermined compensation force values, a compensation force value that corresponds to a value of a signal representing a position of one of the object tables;

generating a force adjustment signal in response to the compensation force value; and applying a force to the object table according to the force adjustment signal.

13. The device manufacturing method according to claim 12, wherein said generating includes generating the force adjustment signal as a function of the compensation force value and a velocity of the object table.

14. The device manufacturing method according to claim 13, wherein said generating includes generating the force adjustment signal as a product of the compensation force value and the velocity of the object table.

15. The device manufacturing method according to claim 12, said method further comprising:

reading a second compensation force value; and generating a second force adjustment signal as a function of the second compensation force value and a velocity of said object table, wherein said applying a force includes applying a force to the object table according to the second force adjustment signal.

16. The device manufacturing method according to claim 12, wherein said selecting includes selecting at leant two compensation farce values, and wherein said generating includes generating the force adjustment signal in response to the at least two compensation force values, and wherein said applying includes applying a force to the object table according to the force adjustment signal in at least two degrees of freedom.

17. The device manufacturing method according to claim 12, wherein the signal representing the position of the object table represents the position of the object table in said at least two degrees of freedom, and wherein said applying includes applying a force according to the force adjustment signal to move the object table in at least two degrees of freedom.

18. A device manufactured according to the method of claim 12.

19. A measurement method, said method comprising:

controlling a positioning structure of a lithographic projection apparatus to move an object table of the lithographic projection apparatus in at least a first degree of freedom such that the object table moves with a constant speed in the first degree of freedom; and to a first location, and as a function of a first position of the object table in the first degree of freedom, storing information relating to a value of a force exerted by the positioning structure to keep the object table moving with the constant speed in the first degree of freedom, and to a second location different from the first location, and as a function of a second position of the object table in the first degree of freedom different from the first position, storing information relating to a value of a force exerted by the positioning structure to keep the object table moving with the constant speed in the first degree of freedom.

20. A measurement method according to claim 19, wherein said controlling the positioning structure includes controlling the positioning structure to keep a position of the abject table constant in at least a second degree of freedom, and wherein at least one among said storing as a function of a first position and said storing as a function of a second position includes storing information relating to a value of a force exerted by the positioning structure to keep the position of the object table constant in at least the second degree of freedom.

21. The lithographic projection apparatus according to claim 1, wherein the force adjustment signal is based on a velocity of the object table.

22. The lithographic projection apparatus according to claim 1, wherein the compensation force value is based on a measured value of a force exerted on the object table.

23. The lithographic projection apparatus according to claim 1, wherein the compensation force value is based on a measured value of a position-dependent force exerted on the object table.

24. The lithographic projection apparatus according to claim 1, said apparatus comprising a data storage device configured to store the plurality of predetermined compensation force values.

25. The device manufacturing method according to claim 12, wherein the force adjustment signal is bused on a velocity of the object table.

26. The device manufacturing method according to claim 12, wherein the compensation force value is based on a measured value of a force exerted on the object table.

27. The device manufacturing method according to claim 12, wherein the compensation force value in based on a measured value of a position-dependent force exerted on the object table.

28. The device manufacturing method according to claim 12, said method comprising storing the plurality of predetermined compensation force values to a data storage device.

* * * * *